(12) United States Patent
Belady

(10) Patent No.: US 8,395,896 B2
(45) Date of Patent: Mar. 12, 2013

(54) REDUNDANT COOLING SYSTEMS AND METHODS

(75) Inventor: Christian L. Belady, Richardson, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1068 days.

(21) Appl. No.: 11/678,590

(22) Filed: Feb. 24, 2007

(65) Prior Publication Data

US 2008/0205003 A1 Aug. 28, 2008

(51) Int. Cl.
*H05K 7/20* (2006.01)

(52) U.S. Cl. .......... 361/698; 361/679.47; 361/696; 361/699; 62/259.2

(58) Field of Classification Search .......... None
See application file for complete search history.

(56) References Cited

U.S. PATENT DOCUMENTS

| | | | | |
|---|---|---|---|---|
| 5,474,120 A * | 12/1995 | Severson et al. | ............. | 165/296 |
| 6,181,556 B1 | 1/2001 | Allman | | |
| 6,525,934 B1 | 2/2003 | Nakanishi et al. | | |
| 6,771,497 B2 | 8/2004 | Chen et al. | | |
| 6,779,595 B1 | 8/2004 | Chiang | | |
| 6,804,115 B2 | 10/2004 | Lai | | |
| 6,903,930 B2 * | 6/2005 | DiStefano et al. | ............. | 361/700 |
| 6,909,608 B2 | 6/2005 | Fan | | |
| 6,918,429 B2 | 7/2005 | Lin et al. | | |
| 7,088,565 B2 * | 8/2006 | Watanabe et al. | ............. | 361/103 |
| 2003/0057546 A1 * | 3/2003 | Memory et al. | ............. | 257/706 |
| 2005/0115257 A1 * | 6/2005 | Goth et al. | ............. | 62/186 |
| 2005/0145371 A1 * | 7/2005 | DiStefano et al. | ........ | 165/104.21 |
| 2006/0227504 A1 * | 10/2006 | Chen et al. | ............. | 361/687 |

* cited by examiner

*Primary Examiner* — Courtney Smith

(57) ABSTRACT

Redundant cooling systems and methods are disclosed. In an exemplary embodiment, a method for redundant cooling system of computer systems and other electronics may comprise thermally connecting a cooling fluid to one or more heat-generating components to absorb heat from the heat-generating components during operation. The method may also comprise thermally connecting the cooling fluid to a primary coolant and a secondary coolant. The method may also comprise exchanging heat between the cooling fluid and the primary coolant or the secondary coolant to remove heat from the cooling fluid even if one of the cooling sources is unavailable.

15 Claims, 3 Drawing Sheets

REDUNDANT COOLING SYSTEMS AND METHODS

BACKGROUND

Electronic data centers including multiple computer systems (e.g., rack-mounted servers) and other electronic devices are becoming more densely packed to provide more computing power while at the same time consuming less physical space. Accordingly, heat dissipation continues to be a concern. If not properly dissipated, heat generated during operation can shorten the life span of various components and/or generally result in poor performance.

Various thermal management systems are available for computer systems and other electronic devices, and typically include a heat sink and/or a cooling fan. The heat sink is positioned adjacent the electronic components generating the most heat (e.g., the processor) to absorb heat. A cooling fan may be positioned to blow air across the heat sink and out an opening formed through the computer housing to dissipate heat into the surrounding environment. The use of water-cooled systems is also being explored. However, if the heat sink, cooling fan, and/or water supply fails or is otherwise taken offline (e.g., or maintenance purposes), one or more of the computer systems and/or other electronic devices may need to be taken offline as well to prevent overheating until the cooling system can be returned to an operational state. Any such shutdown, even a partial shutdown, can have a far reaching negative impact and therefore is considered undesirable.

DETAILED DESCRIPTION

Briefly, redundant cooling systems and methods may be implemented to dissipate heat during operation of various computing and electronic devices, such as in the rack-mount environment commonly used by electronic data centers. In an exemplary embodiment, the cooling systems and methods include a plurality of cooling sources (e.g., liquid and air) for redundant cooling operations. If one of the cooling sources fails, is taken offline, or is otherwise unavailable, the remaining cooling source may continue to provide sufficient cooling to prevent a partial or even complete shut down of the computing and/or other electronic devices. Such a configuration may help reduces the likelihood of a failure that cripples the entire system.

Figure 1:
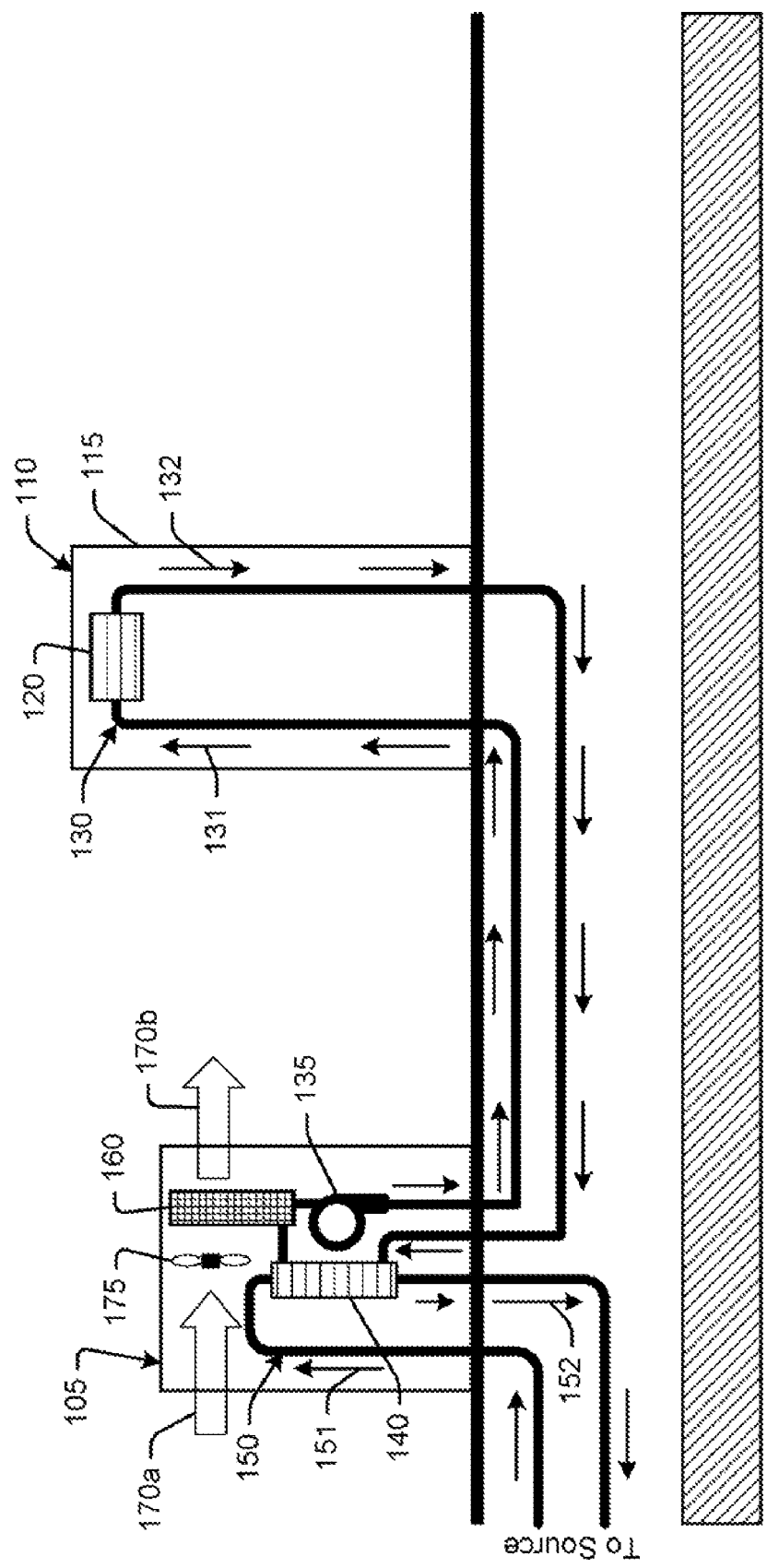
FIG. 1 is a cross-sectional side view of an exemplary redundant cooling system as it may be implemented as a separate unit in a rack-mount environment for server computers.

FIG. 1 is a cross-sectional side view of an exemplary redundant cooling system 100 as it may be implemented as a separate unit 105 in a rack-mount environment for server computers. Of course the rack-mount environment is shown only for purposes of illustration. The systems and methods described herein are not limited to use with any particular physical environment. For example, FIG. 1 shows a room view in a raised floor environment, but unit 105 can be a stand alone unit that sits on the raised floor. The systems and methods also are not limited to use with any particular type of computers or other electronic devices. For example, a rack-mount 110 may be provided with many servers and/or a stand-alone server may sit on the raised floor.

In an exemplary embodiment, a plurality of computer systems and/or other electronic devices (not shown, but readily understood in the computer arts) may be arranged in a rack or rack-mount 110. The rack-mount 110 may include an outer enclosure or housing 115. The server computers are typically arranged within the housing 115 in a stacked relation relative to one another. Of course, a wide variety of other types of rack-mount environments are also commercially available. For example, larger rack-mount environments enable the server computers to be arranged in a stacked relation and a side-by-side relation relative to one another.

As is well-known, server computers typically include one or more processing units or processors, data storage, and/or memory. Server computers may also be operatively associated with other electronic components, such as, communication and networking devices (routers, switches, hubs), and a wide variety of input/output (I/O) devices, which may also be arranged in the rack-mount 110.

During operation, the server computers and other electronic components may generate heat. Accordingly, the cooling system 100 may be implemented to absorb and remove heat from the rack-mount 110. In an exemplary embodiment, the cooling system 100 includes one or more cooling element 120 such as a cold plate located near or adjacent the components generating the heat (not shown, but typically mounted in housing 115 as described above). The cooling element 120 functions to absorb heat generated by the various heat-generating components.

In an exemplary embodiment, the cooling element 120 is made for a fluid to flow through it and is mounted to a heat source (e.g., a processor) for quickly and efficiently absorbing heat. It is noted that there exist many different types of cooling elements, and the systems and methods described herein are not limited to any particular type of cooling elements.

During operation, a cooling fluid (e.g., water or other liquid) may be circulated through lines 130 (e.g., via pump 135) to remove heat absorbed by the cooling element 120, as illustrated by arrow 131 (cool fluid) and arrow 132 (warmed fluid). The warmed fluid may pass through at least one heat exchanger in the cooling unit 105 to be cooled before being re-circulated to the rack-mount 110. It is noted that the heat exchanger functions to transfer heat from one medium to another (e.g., between fluids) while physically isolating the cooling mediums.

In an exemplary embodiment, a first heat-removing element may be implemented, such as heat exchanger 140, provided to thermally connect the warmed fluid with a primary coolant circulated through lines 150, as illustrated by arrow 151 (cool fluid) and arrow 152 (warmed fluid). For example, the primary coolant may be chilled water or other liquid delivered to the first heat exchanger 140 by the building's water supply or other source. A second heat-removing element, such as heat exchanger 160, may be provided to thermally connect the warmed fluid (in lines 130) with a secondary coolant. For example, the secondary coolant may be air (illustrated by arrows 170*a*, 170*b*) circulated through the second heat exchanger 160 by fan or blower 175 to remove heat to the surrounding environment (e.g., outside of the cooling unit 105).

Of course the heat-removing elements are not limited to heat exchangers, and may include by way of example, compressor-based refrigeration, or other suitable components. It is also noted that in exemplary embodiments, the liquid is the primary heat remover and the fan 175 is only be turned on during an emergency. Although the systems and methods described herein are not limited to such an implementation.

In an exemplary embodiment, the primary and secondary coolants are independent of one another and the cooling fluid in lines 130 is physically isolated from the primary coolant in lines 150 and the secondary coolant (e.g., air 170a, 170b) to reduce the risk of cross-contamination. In addition, only one of the primary and secondary coolants is used at any given time, and the secondary coolant may only be activated if the primary coolant is unavailable. This may reduce energy consumption while still making the secondary coolant available to provide sufficient cooling for operations (e.g., of one or more server computer) in the event that the primary coolant becomes unavailable. Alternatively, the secondary coolant may be brought online to provide additional cooling capacity.

It is noted that although only primary and secondary coolants are shown, each having separate heat exchangers, any number may be implemented. In addition, the systems and methods are not limited to a one-to-one correspondence of heat exchanger to coolant. In other embodiments, for example, the same heat exchanger may be used with alternate coolants. The specific implementation may depend on any of a wide variety of different design considerations, such as, the heat being generated, the desired cooling, and the surrounding environment, to name only a few examples.

In an exemplary embodiment, power consumption to the computer systems and/or other electronic devices may be automatically reduced in the event that one or more of the cooling sources is unavailable. That is, operation of the heat-generating components is constrained by the ability of the cooling system 100 to dissipate heat. In some circumstances, at least some of the components (e.g., critical servers) may continue to operate at full power while power to other components (e.g., to alternate or backup systems) is reduced or even turned off to meet these constraints. In any event, the loss of a cooling source may result in a performance degradation, but does not result in a complete shut down. In some embodiments, the loss of a cooling source does not even result in a partial shut down.

It is noted that any of a wide variety of configurations of the cooling system 100 may be implemented to accomplish these and other advantages. Some examples of different configurations are discussed below with reference to the embodiments shown in FIGS. 2 and 3.

Figure 2:
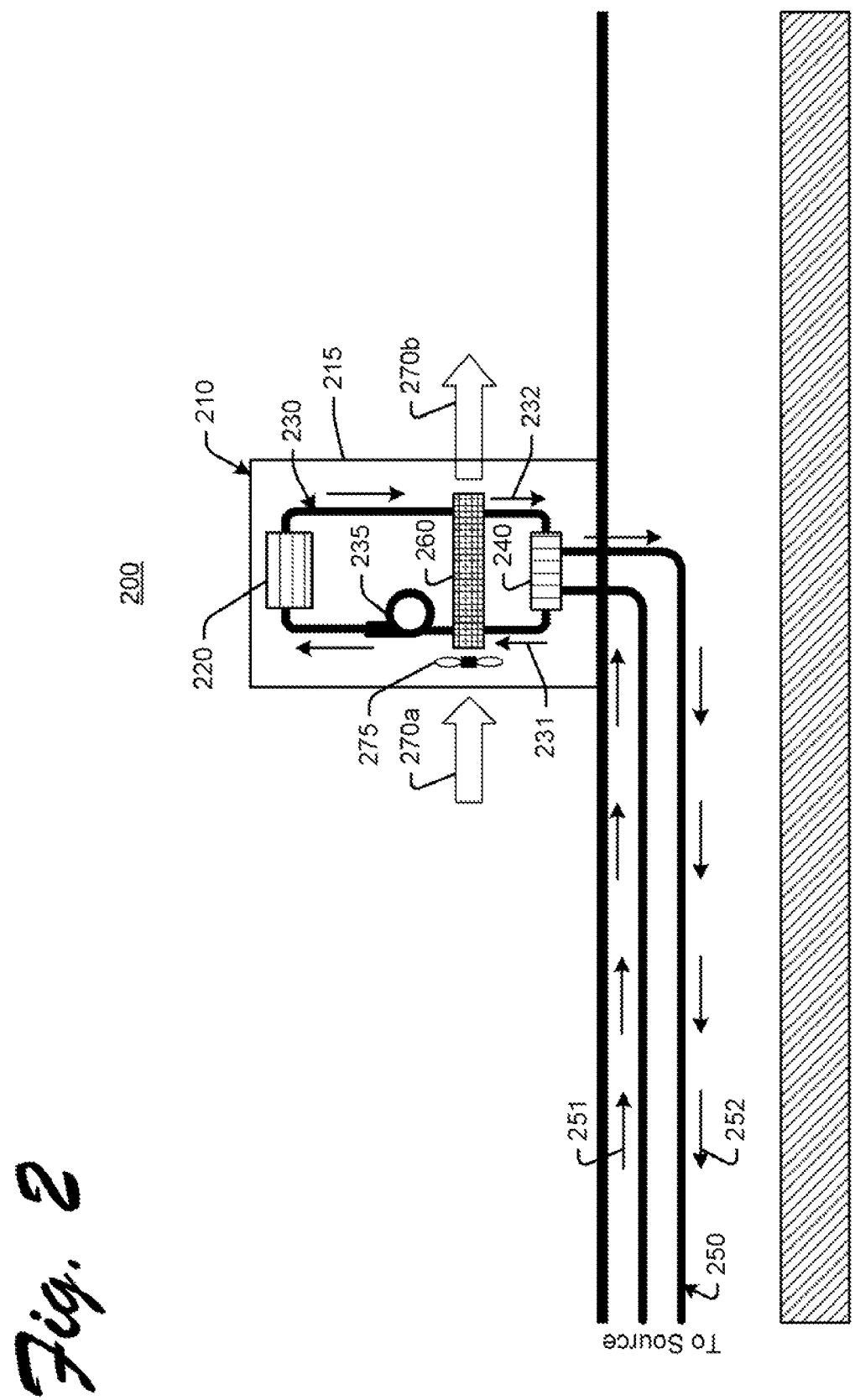
FIG. 2 is a cross-sectional side view of another exemplary redundant cooling system as it may be implemented within the housing of the rack-mount itself.

FIG. 2 is a cross-sectional side view of an exemplary redundant cooling system 200 as it may be implemented within the housing 215 of the rack-mount 210. It is noted that 200-series reference numbers are used in FIG. 2 to refer to corresponding elements of the embodiment of cooling system 100 shown in FIG. 1, and may not be described again with reference to the embodiment shown in FIG. 2.

In an exemplary embodiment, the cooling system 200 includes one or more cooling element 220 located near or adjacent the components generating the heat to absorb this heat from the components. A cooling fluid (e.g., water or other liquid) may be circulated through lines 230 (e.g., via pump 235) to remove heat absorbed by the cooling element 220, as illustrated by arrow 231 (cool fluid) and arrow 232 (warmed fluid). The warmed fluid may pass through at least one heat exchanger in the rack mount 210 to be cooled before being re-circulated to the cooling element 220.

In an exemplary embodiment, a first heat exchanger 240 may be provided to thermally connect the warmed fluid with a primary coolant circulated through lines 250, as illustrated by arrow 251 (cool fluid) and arrow 252 (warmed fluid) from the building's water supply or other source. A second heat exchanger 260 may be provided to thermally connect the warmed fluid (in lines 230) with a secondary coolant. For example, the secondary coolant may be air (illustrated by arrows 270a, 270b) circulated through the second heat exchanger 260 by fan or blower 275 to remove heat to the surrounding environment (e.g., outside of the rack-mount 210). Such an embodiment is particularly useful for failed building coolant, although other advantages are also contemplated.

Figure 3:
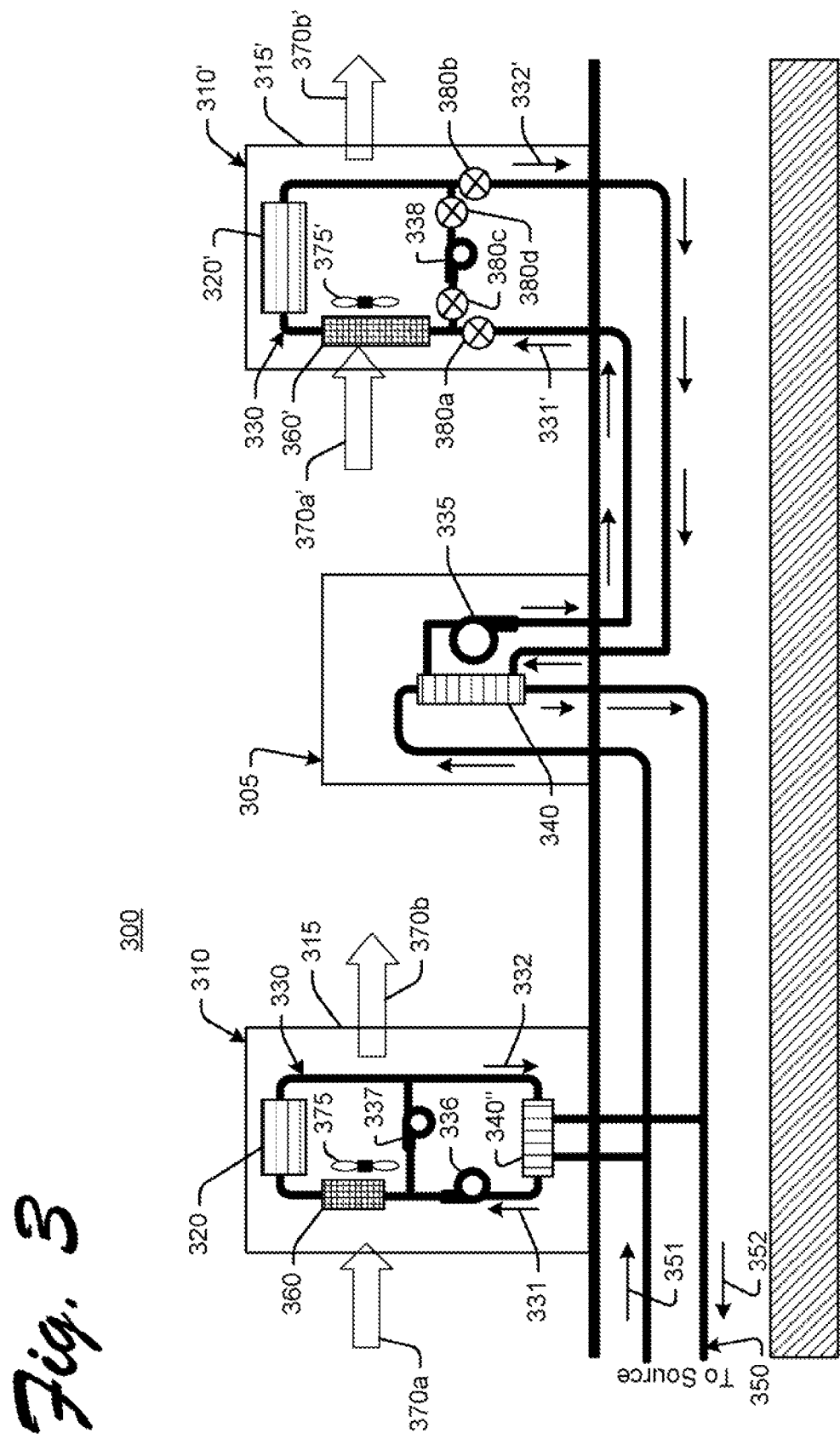
FIG. 3 is a cross-sectional side view of another exemplary redundant cooling system as it may be implemented in a rack-mount environment both as a separate unit and within the housing of one or more rack-mounts.

FIG. 3 is a cross-sectional side view of another exemplary redundant cooling system 300 as it may be implemented in a rack-mount environment both as a separate unit 305 and within the housing 315, 315' of one or more rack-mounts 310 and 310'. It is noted that 300-series reference numbers are used in FIG. 3 to refer to corresponding elements of the embodiment of cooling system 100 shown in FIG. 1, and may not be described again with reference to the embodiment shown in FIG. 3.

In an exemplary embodiment, the cooling system 300 includes one or more cooling element 320 and 320' located in each rack mount 310 and 310' near or adjacent the components generating the heat to absorb this heat from the components. A cooling fluid (e.g., water or other liquid) may be circulated in each rack mount 310 and 310' through lines 330 and 330' (e.g., via pumps 335-338) to remove heat absorbed by the cooling elements 320 and 320'. The warmed fluid may pass through at least one heat exchanger in the rack mount (as illustrated by heat exchanger 340" in rack mount 310) and/or the cooling unit 305 (as illustrated by heat exchanger 340) to be cooled before being re-circulated to the cooling elements 320 and 320'. These heat exchangers may be provided to thermally connect the warmed fluid with a primary coolant circulated through lines 350, as illustrated by arrow 351 (cool fluid) and arrow 352 (warmed fluid) from the building's water supply or other source.

Additional or backup heat exchangers may also be provided to thermally connect the warmed fluid with a secondary coolant. In the embodiment shown in FIG. 3, the secondary coolant is air (illustrated by arrows 370a, 370b and 370a', 370b') circulated through heat exchangers 360 and 360' by fans or blowers 375 and 375' in the rack mounts 310 and 310' to remove heat to the surrounding environment.

Also in an exemplary embodiment, control valves may be provided at various locations on the fluid lines. In the embodiment shown in FIG. 3, shut-off valves 380a-d are provided on fluid lines 330 in the rack-mount 310'. During operation, shut-off valves 380a-d may be opened and shut-off valves 380c-d closed when the primary coolant is online. When the primary coolant is offline, shut-off valves 380a-b may be closed, shut-off valves 380c-d may be opened, and pump 338 may be turned on to re-circulate the warmed cooling fluid locally for cooling by airflow 370a'-370b'. In this way, the system may continue to operate even when heat exchangers 340 or 340' are being serviced or replaced. Of course, the valves may be manually operated, or automatically operated based on input or feedback from a monitoring/management system (e.g., for sensing failures).

It is noted that the exemplary embodiments discussed above are provided for purposes of illustration. Still other embodiments are also contemplated. For example, more than one primary and/or secondary coolant may be provided with heat exchangers in any of a wide variety of different configurations. In addition, cooling source failures may be detected automatically by the building monitoring system and/or with sensors (e.g., pressure, flow, temperature sensors) included as part of the cooling system itself to open/close valves, etc.

It is also noted that, although the systems and methods are described with reference to computer systems, in other exemplary embodiments, the cooling systems may be implemented for other electronic devices, such as, e.g., peripheral devices for computers, video and audio equipment, etc.

In addition to the specific embodiments explicitly set forth herein, other aspects and embodiments will be apparent to those skilled in the art from consideration of the specification disclosed herein. It is intended that the specification and illustrated embodiments be considered as examples only.

The invention claimed is:

1. A redundant cooling system for computers and other electronics, comprising:
   at least one cooling; element thermally connecting a cooling fluid to one or more heat-generating components in a rack-mount so that the cooling fluid absorbs heat from the heat-generating components in the rack-mount during operation;
   an external cooling unit located outside of the rack mount to transfer heat from the cooling fluid to a primary coolant fluid;
   a backup heat exchanger in the rack-mount, the backup heat exchanger thermally connected to a secondary air coolant to transfer heat absorbed by the cooling fluid to the secondary air coolant when the primary coolant fluid is offline.

2. The cooling system of claim 1 wherein the secondary air coolant is automatically activated if the primary coolant fluid is unavailable.

3. The cooling system of claim 1 wherein the cooling fluid is physically isolated from both the primary coolant fluid and the secondary air coolant.

4. A method of redundant cooling for computer systems and other electronics, comprising:
   thermally connecting a cooling fluid to one or more heat-generating components in a rack-mount to absorb heat from the heat-generating components while the cooling fluid circulates in the rack-mount during operation;
   exchanging heat between the cooling fluid and a primary liquid coolant at an external cooling unit located outside of the rack-mount;
   exchanging heat between the cooling fluid and a secondary air coolant at a backup heat exchanger in the rack mount when the primary liquid coolant is offline.

5. The method of claim 4 wherein the cooling fluid is physically isolated from the primary liquid coolant and the secondary air coolant.

6. The method of claim 4, wherein the secondary air coolant is automatically activated if the primary liquid coolant is unavailable.

7. The method of claim 4 wherein exchanging heat is with either the primary liquid coolant or the secondary air coolant but not both at the same time.

8. The method of claim 4 further comprising providing cooling for a plurality of rack-systems.

9. The method of claim 4 further comprising automatically adjusting power to at least one of the one or more heat-generating components based on heat-removal capacity of the cooling system.

10. A redundant cooling system comprising:
    fluid means for absorbing heat from at least one heat-generating component in a rack-mount during operation;
    primary cooling means external to the rack-mount for removing heat from the fluid means;
    secondary cooling means as a backup in the rack-mount for removing heat from the fluid means as the fluid means continues circulating, the secondary cooling means only activating if the primary cooling means is unavailable; and
    means for operating in a first configuration and a second configuration;
    wherein in the first configuration the fluid means recirculates locally in the rack mount for cooling by the secondary cooling means when an external cooling means is offline; and
    wherein in the second configuration the fluid means circulates external to the rack-mount for cooling by the primary cooling means.

11. The system of claim 10 further comprising means for throttling power to at least one computer system if only the secondary cooling means is available.

12. The system of claim 10 further comprising heat exchanging means thermally interchangeably connecting the fluid means to either the primary cooling means or the secondary cooling means, the fluid means continuing to circulate and remove heat by the secondary cooling means even if the primary cooling means is unavailable.

13. The system of claim 12 wherein the heat exchanging means includes refrigeration means.

14. The cooling system of claim 1 further comprising at least one control valve operable between a first position and a second position, wherein in the first position the cooling fluid recirculates locally in the rack mount for cooling by airflow at the backup heat exchanger when the external cooling unit is offline, and wherein in the second position the cooling fluid circulates through the external cooling unit.

15. The method of claim 4 further comprising:
    operating at least one control valve between a first position and a second position;
    when the at least one control valve is in the first position, recirculating the cooling fluid locally in the rack mount for cooling by airflow at the backup heat exchanger when the external cooling unit is offline; and
    when the at least one control valve is in the second position, circulating the cooling fluid through the external cooling unit.

* * * * *

UNITED STATES PATENT AND TRADEMARK OFFICE
CERTIFICATE OF CORRECTION

PATENT NO. : 8,395,896 B2
APPLICATION NO. : 11/678590
DATED : March 12, 2013
INVENTOR(S) : Christian L. Belady It is certified that error appears in the above-identified patent and that said Letters Patent is hereby corrected as shown below:

In the Claims:

In column 5, line 20, Claim 1, delete "cooling;" and insert -- cooling --, therefor.

Signed and Sealed this
Sixth Day of August, 2013

Teresa Stanek Rea
*Acting Director of the United States Patent and Trademark Office*